United States Patent
Balakrishnan et al.

(10) Patent No.: US 10,074,720 B2
(45) Date of Patent: Sep. 11, 2018

(54) DIGITAL ALLOY VERTICAL LAMELLAE FINFET WITH CURRENT FLOW IN ALLOY LAYER DIRECTION

(71) Applicant: International Business Machines Corporation, Armonk, NY (US)

(72) Inventors: Karthik Balakrishnan, White Plains, NY (US); Stephen W. Bedell, Wappingers Falls, NY (US); Pouya Hashemi, White Plains, NY (US); Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/159,982

(22) Filed: May 20, 2016

(65) Prior Publication Data

US 2017/0338308 A1    Nov. 23, 2017

(51) Int. Cl.
  *H01L 21/02*   (2006.01)
  *H01L 29/10*   (2006.01)
  *H01L 29/161*  (2006.01)
  *H01L 29/165*  (2006.01)
  *H01L 29/78*   (2006.01)
  *H01L 29/66*   (2006.01)

(52) U.S. Cl.
  CPC ........ *H01L 29/1054* (2013.01); *H01L 29/161* (2013.01); *H01L 29/165* (2013.01); *H01L 29/6681* (2013.01); *H01L 29/7851* (2013.01)

(58) Field of Classification Search
  CPC . H01L 29/1054; H01L 29/161; H01L 29/165; H01L 29/6681; H01L 29/7851

USPC .................................................. 257/190, 616
See application file for complete search history.

(56) References Cited

U.S. PATENT DOCUMENTS

| | | | |
|---|---|---|---|
| 2004/0004271 A1 | 1/2004 | Fukuda et al. | |
| 2007/0045611 A1* | 3/2007 | Zhu | H01L 29/78696 257/20 |
| 2011/0012090 A1* | 1/2011 | Singh | B82Y 10/00 257/24 |
| 2011/0233512 A1* | 9/2011 | Yang | B82Y 10/00 257/9 |

(Continued)

OTHER PUBLICATIONS

Lee, M. et al, "Hole mobility enhancements in nanometer-scale strained-silicon heterostructures grown on Ge-rich relaxed Si 1—x Ge x", Journal of Applied Physics, vol. 94, No. 4, Aug. 2003, pp. 2590-2596.

(Continued)

*Primary Examiner* — Dzung Tran
(74) *Attorney, Agent, or Firm* — Scully, Scott, Murphy & Presser, P.C.; Louis J. Percello, Esq.

(57) ABSTRACT

After forming semiconductor fins including vertically oriented alternating first digital alloy sublayer portions comprised of SiGe and second digital alloy sublayer portions comprised of Si on sidewalls of a sacrificial fin located on a substrate, the sacrificial fin is removed, leaving the semiconductor fins protruding from a top surface of the substrate. The SiGe and Si digital alloy sublayer portions are formed using isotopically enriched Si and Ge source gases to minimize isotopic mass variation in the SiGe and Si digital alloy sublayer portions.

15 Claims, 6 Drawing Sheets

(56) References Cited

U.S. PATENT DOCUMENTS

| | | | | |
|---|---|---|---|---|
| 2012/0032334 A1* | 2/2012 | Lee | ................... | C23C 16/0272 |
| | | | | 257/770 |
| 2012/0199814 A1* | 8/2012 | Berger | ................ | H01L 29/7391 |
| | | | | 257/24 |
| 2013/0334610 A1* | 12/2013 | Moroz | ............ | H01L 21/823821 |
| | | | | 257/369 |
| 2014/0175543 A1* | 6/2014 | Glass | .............. | H01L 21/823431 |
| | | | | 257/337 |
| 2014/0284719 A1* | 9/2014 | Khakifirooz | .......... | H01L 21/845 |
| | | | | 257/351 |
| 2014/0353752 A1* | 12/2014 | Cheng | .................. | H01L 29/785 |
| | | | | 257/347 |
| 2015/0270344 A1* | 9/2015 | Cheng | .................. | H01L 29/161 |
| | | | | 257/616 |

OTHER PUBLICATIONS

Lee, M. et al., "Strained Si, SiGe, and Ge channels for high-mobility metal-oxide-semiconductor field-effect transistors", Journal of Applied Physics, vol. 97, 2005, pp. 011101-1 to 011101-27.

Asen-Palmer, M. et al., "Thermal conductivity of germanium crystals with different isotopic compositions", Physical Review B, vol. 56, No. 15, Oct. 15, 1997, pp. 9431-9447.

Lee, B. et al., "Performance enhancement on sub-70nm strained silicon SOI MOSFETs on Ultra-thin Thermally Mixed Strained silicon/SiGe on Insulator(TM-SGOI) substrate with Raised S/D", Electron Devices Meeting, IEDM, Dec. 2002, pp. 946-948.

\* cited by examiner

DIGITAL ALLOY VERTICAL LAMELLAE FINFET WITH CURRENT FLOW IN ALLOY LAYER DIRECTION

BACKGROUND

The present application relates to semiconductor devices, and more particularly to fin field effect transistors (FinFETs) having vertically oriented digital alloy channels.

The use of compressively strained silicon germanium (SiGe) alloys is well-known to increase the mobility of charge carriers (i.e., holes) in p-type FETs compared to conventional silicon-based FETs. The SiGe alloy system is one of few binary semiconductor alloys in which two constituent elements, silicon (Si) and germanium (Ge), form a perfectly miscible substitutional solid solution throughout the compositional range and simultaneously retain a random order with respect to atomic position. By varying compositions of the SiGe alloys, a wide range of strain (roughly 0-4%) can be established in the SiGe layer that allows enhancing device performance (e.g., higher on-state current) without the need for geometric scaling in the devices. However, for a random SiGe alloy, there is an increased carrier and phonon scattering due to the mass variation of constituent atoms in the lattice compared to an ordered SiGe alloy. The increased scattering reduces both charge carrier mobility and thermal conductivity, thus negatively impacting device performance. By imposing order (e.g., by forming SiGe digital alloy) to an otherwise random SiGe alloy during growth, scattering dues to the mass variance can be dramatically reduced.

SUMMARY

The present application provides a method of forming semiconductor fins that include alternating first digital alloy sublayer portions comprised of SiGe and second digital alloy sublayer portions comprised of Si protruding from a top surface of a substrate. The SiGe and Si digital alloy sublayer portions are formed using isotopically enriched Si and Ge source gases to minimize isotopic mass variation in the SiGe and Si digital alloy sublayer portions. As a result, FinFETs with improved carrier and thermal transport properties can be obtained.

In one aspect of the present application, a semiconductor structure is provided. The semiconductor structure includes a semiconductor fin located on a substrate. The semiconductor fin includes alternating first digital alloy sublayer portions and second digital alloy sublayer portions protruding from a top surface of the substrate. Each of the first digital alloy sublayer portions is comprised of SiGe, and each of the second digital alloy sublayer portions is comprised of Si.

In one aspect of the present application, a method of forming a semiconductor structure is provided. The method includes forming semiconductor fins on sidewalls of a sacrificial fin located on a substrate. Each of the semiconductor fins includes alternating first digital alloy sublayer portions and second digital alloy sublayer portions protruding from a top surface of the substrate. Each of the first digital alloy sublayer portions is comprised of SiGe, and each of the second digital alloy sublayer portions is comprised of Si. The sacrificial fin is then removed from the structure.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
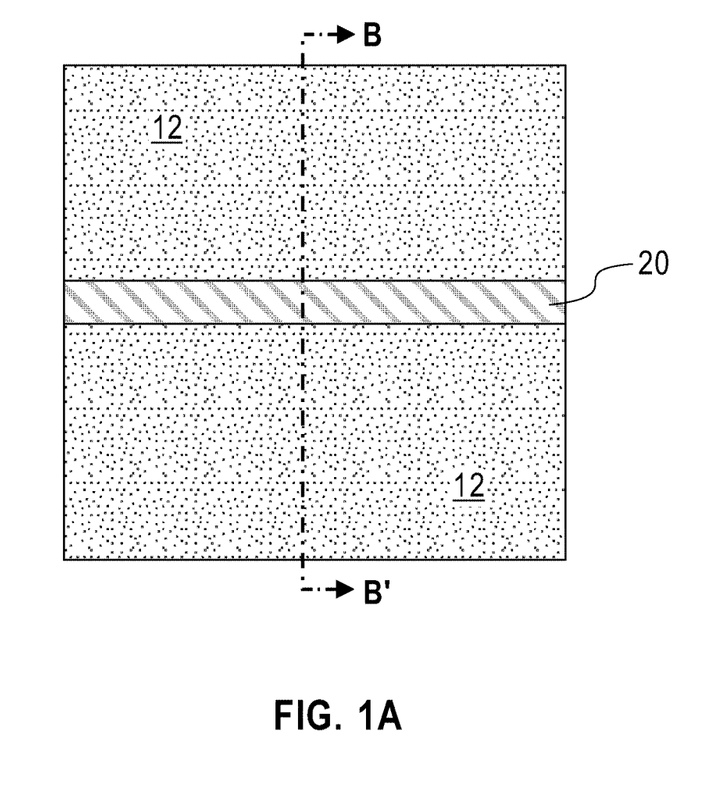
FIG. 1A is a top-down view of an exemplary semiconductor structure including at least one sacrificial fin formed over a top surface of a substrate according to an embodiment of the present application.
Figure 1B:
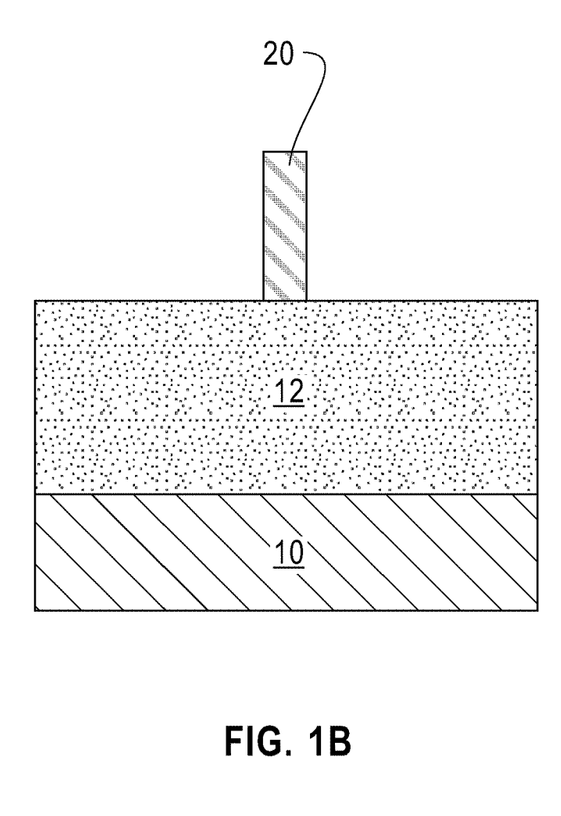
FIG. 1B is a cross-sectional view of the exemplary semiconductor structure of FIG. 1A along line B-B'.

Referring to FIGS. 1A and 1B, an exemplary semiconductor structure that can be employed in one embodiment of the present application includes at least one sacrificial fin 20 formed over a substrate. As used herein, a "fin" is a structure that has a pair of sidewalls along a lengthwise direction that is longer than a pair of end walls along a widthwise direction. The sacrificial fin 20 may have a rectangular shape in cross-section. The width of the sacrificial fin 20 is typically greater than a minimum feature size that may be formed using a specific lithographic technique. In one embodiment, the width of the sacrificial fin 20 is from 8 nm to 30 nm, although lesser and greater widths can also be employed. The spacing between adjacent sacrificial fins 20 is defined by the desired fin pitch. For example, adjacent sacrificial fins 20 may be separated by a spacing ranging from 40 nm to 200 nm, although lesser and greater pitches can also be employed.

In one embodiment, the at least one sacrificial fin 20 can be formed by providing a semiconductor-on-insulator (SOI) substrate including, from bottom to top, a handle substrate 10, a buried insulator layer 12 and a Ge-containing semiconductor layer(not shown) from which the at least one sacrificial fin 20 is formed.

The handle substrate 10 may include a semiconductor material such as, for example, Si, Ge, SiGe, SiC, SiGeC, a III-V compound semiconductor, a II-VI compound semiconductor or any combinations thereof. In one embodiment, the handle substrate 10 is a Si substrate. The handle substrate 10 provides mechanical support to the buried insulator layer 12 and the top Ge-containing semiconductor layer. The thickness of the handle substrate 10 can be from 30 μm to about 2 mm, although less and greater thicknesses can also be employed.

The buried insulator layer 12 may include a dielectric material such as silicon dioxide, silicon nitride, silicon oxynitride, boron nitride or a combination thereof. In one embodiment, the buried insulator layer 12 may be formed by a deposition process, such as chemical vapor deposition (CVD), plasma enhanced chemical vapor deposition (PECVD) or physical vapor deposition (PVD) and then be bonded to the handle substrate 10. In another embodiment, the buried insulator layer 12 may be formed using a thermal growth process, such as thermal oxidation, to convert a surface portion of the handle substrate 10. In yet another embodiment, the buried insulator layer 12 can also be formed by implanting oxygen atoms into a bulk semiconductor substrate and thereafter annealing the structure. The thickness of the buried insulator layer 12 can be from 50 nm to 200 nm, although lesser or greater thicknesses can also be employed.

The Ge-containing semiconductor layer may include Ge or SiGe with a high Ge content. By "high Ge content" it is meant a SiGe layer having a Ge concentration that is greater than 70 atomic %. The Ge-containing semiconductor layer can represent an uppermost portion of a bulk semiconductor substrate in which oxygen atoms used to form the buried insulating layer 12 are implanted therein. Alternatively, the Ge-containing semiconductor layer may be formed using a smart cut process where two semiconductor wafers are bonded together with an insulator layer in between. The Ge-containing semiconductor layer that is formed may have a thickness from 10 nm to 200 nm, although lesser or greater thicknesses can also be employed.

The at least one sacrificial fin 20 can be formed by lithography and etching of the Ge-containing semiconductor layer of the SOI substrate. The lithographic step includes applying a photoresist layer (not shown) atop the Ge-containing semiconductor layer, exposing the photoresist layer to a desired pattern of radiation, and developing the exposed photoresist layer utilizing a conventional resist developer. The etching process may comprise a dry etch such as reactive ion etching (RIE), a wet etch or a combination thereof. The etching process transfers the pattern in the patterned photoresist layer into the Ge-containing semiconductor layer utilizing the buried insulator layer 12 as an etch stop. The remaining portion(s) of the Ge-containing semiconductor layer after the lithographic patterning constitutes the sacrificial fin(s) 20. After formation of the at least one sacrificial fin 20, the patterned photoresist layer can be removed utilizing a conventional resist stripping process such as, for example, ashing.

Figure 2A:
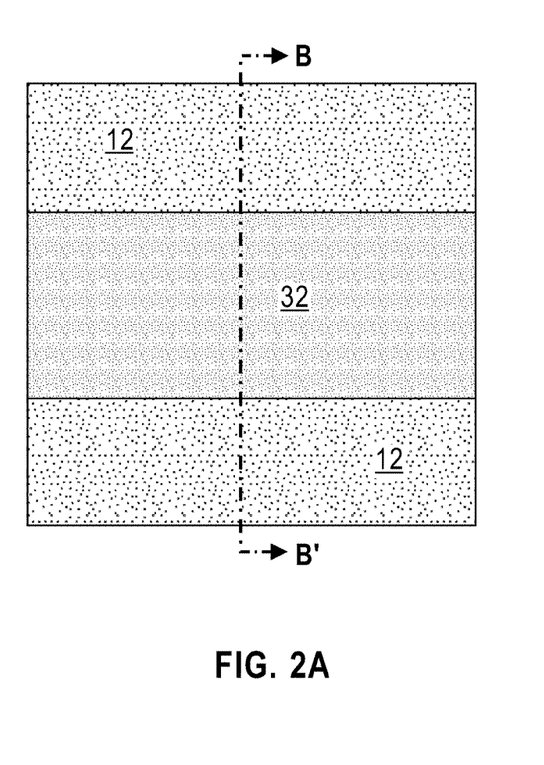
FIG. 2A is a top-down view of the exemplary semiconductor structure of FIG. 1A after forming a digital alloy layer composed of alternating SiGe digital alloy sublayers and Si digital alloy sublayers on sidewall and top surfaces of the sacrificial fin.
Figure 2B:
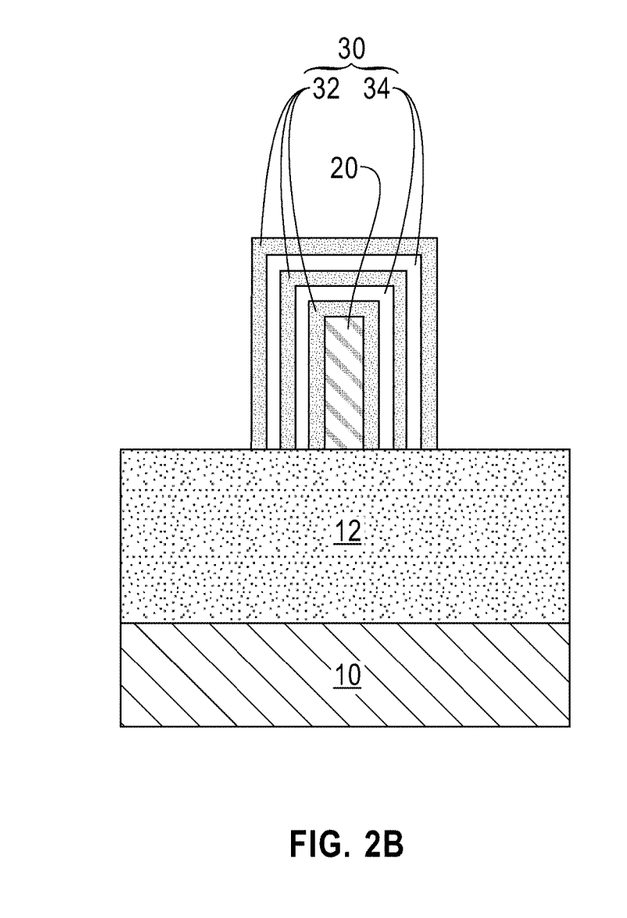
FIG. 2B is a cross-sectional view of the exemplary semiconductor structure of FIG. 2A along line B-B'.

Referring to FIGS. 2A and 2B, a digital alloy layer 30 is formed on exposed surfaces (i.e., sidewall and top surfaces) cladding around the sacrificial fin 20. The digitally alloy layer 30 may be comprised of alternating sublayers of SiGe (herein referred to as SiGe digital alloy sublayers 32) and Si (herein referred to as Si digital alloy sublayers 34). The SiGe digital alloy sublayers 32 typically have a Ge concentration at least 20 atomic % lower than that of the Ge-containing semiconductor layer. In one embodiment, the Ge concentration in the SiGe digital alloy sublayers 32 is from 15 atomic % to 50 atomic %.

The digital alloy layer 30 includes an odd number of digital alloy sublayers (32, 34) such that the bottom digital alloy sublayer (that is, the sublayer that is closest to the sacrificial fin 20) and the top digital alloy sublayer (that is, the sublayer that is farthest from the sacrificial fin 20) are composed of a same semiconductor material. In one embodiment and as shown in FIG. 2B, the digital alloy layer 30 is comprised of three SiGe digital alloy sublayers 32 alternating with two Si digital alloy sublayers 34 with a SiGe digital alloy sublayer 32 in direct contact with the sacrificial fin 20. It should be noted that although in FIG. 2B the bottom and the top digital alloy sublayers 32 are depicted as being composed of SiGe, in another embodiment, the bottom and the top digital alloy sublayers 32 may be composed of Si.

The digital alloy layer 30 may be formed utilizing a selective epitaxial growth (or deposition) process. The term "epitaxial growth or deposition" means the growth of a semiconductor material on a deposition surface of a semiconductor material, in which the semiconductor material being grown has the same crystalline characteristics as the semiconductor material of the deposition surface. For example, an epitaxial semiconductor material deposited on a {100} surface will take on a {100} orientation. During the selective epitaxial growth process, the semiconductor material grows only on exposed semiconductor surfaces, i.e., the top and sidewall surfaces of the sacrificial fins 20 and a surface of each underlying sublayer 32/34 once formed and does not grow on the dielectric surface, such as the surface of the buried insulator layer 12.

The SiGe digital alloy sublayers 32 and Si digital alloy sublayers 34 may be formed, for example, by CVD or molecular beam epitaxy (MBE). The temperature for epitaxial deposition process that forms the SiGe and Si digital alloy sublayers 32, 34 typically ranges from 550° C. to 900° C.

A number of Si and Ge source gases may be used for the deposition of the SiGe and Si digital alloy sublayers 32, 34. Exemplary Si gas sources that may be employed include, but are not limited to, silane ($SiH_4$), dichlorosilane ($SiH_2Cl_2$) and silicone tetrachloride ($SiCl_4$). Exemplary Ge source gases that may be used include, but are not limited to, germane ($GeH_4$) and germane tetrachloride ($GeCl_4$). Gases like hydrogen, nitrogen, helium, may be used as carrier gases during the epitaxial growth process.

In one embodiment, the Si and Ge source gases employed are isotopically enriched source gases. The term "isotopically enriched" source gas means the source gas contains a distribution of mass isotopes different from the naturally occurring isotopic distribution, whereby one of the mass isotopes has an enrichment level higher than that present in the naturally occurring level. Using isotopically enriched Si and Ge gas sources can minimize isotopic mass variance in the individual SiGe and Si sublayers 32, 34, thereby improving the thermal conductivity of the digital alloy layer 30. In one embodiment, the Si and Ge source gases employed to form the SiGe and Si digital alloy sublayers 32, 34 may be substantially isotope free.

Each of the SiGe and Si digital alloy sublayers 32, 34 may have a thickness ranging from 1.5 nm and 2 nm. Due to the different growth rates for different lattice planes, the portion of each of the SiGe and Si digital alloy sublayers 32, 34 overlying the top surface of the sacrificial fin 20 may have a thickness greater than the portion of each of the SiGe and Si digital alloy sublayers 32, 34 overlying the sidewalls of the sacrificial fin 20. The total number of SiGe and Si digital alloy sublayers 32, 34 depends on the desired thickness of the digital alloy layer 30, which determines the width of semiconductor fins later formed. In one embodiment, a total thickness of the SiGe and Si digital alloy sublayers 32, 34 is from 8 nm to 12 nm.

Figure 3A:
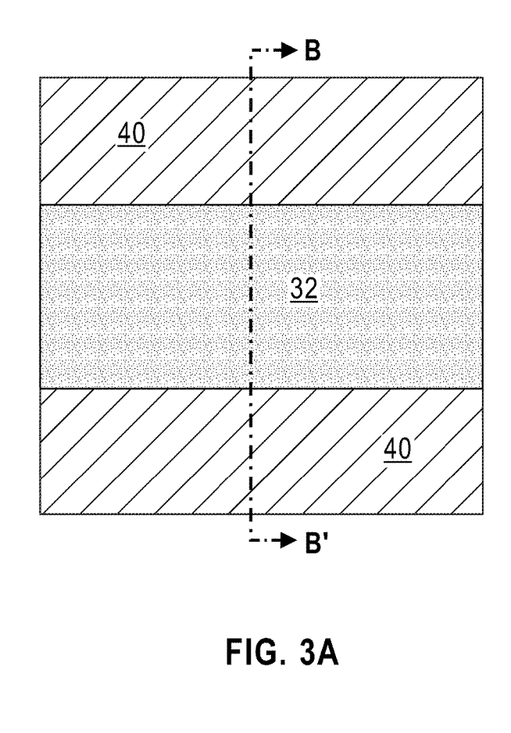
FIG. 3A is a top-down view of the exemplary semiconductor structure of FIG. 2A after forming a sacrificial dielectric layer over the substrate to surround the digital alloy layer.
Figure 3B:
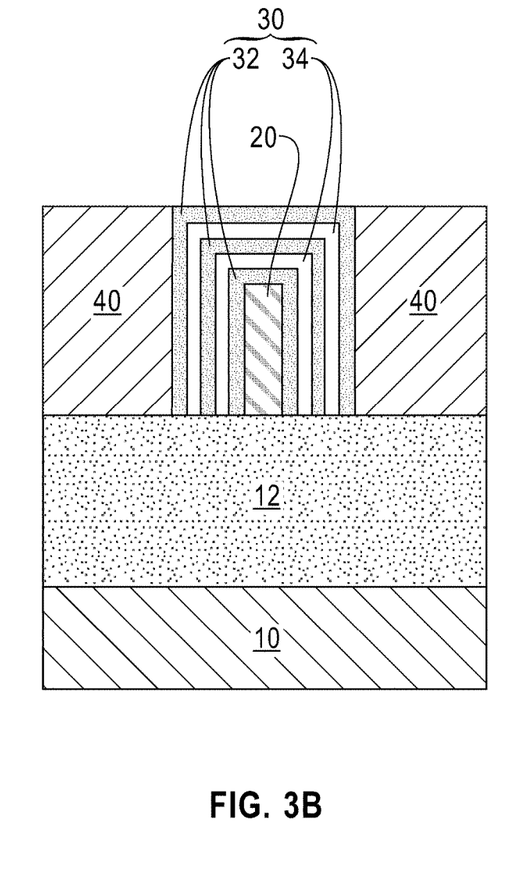
FIG. 3B is a cross-sectional view of the exemplary semiconductor structure of FIG. 3A along line B-B'.

Referring to FIGS. 3A and 3B, a sacrificial dielectric layer 40 is deposited over the buried insulator layer 12 to surround the digital alloy layer 30. The sacrificial dielectric layer 40 may include a dielectric oxide (e.g., silicon dioxide) or a dielectric nitride (e.g., silicon nitride). The sacrificial dielectric layer 40 may be deposited by CVD or PVD. The sacrificial dielectric layer 40 may be first deposited to a thickness such that a top surface of the sacrificial dielectric layer 40 is located above the topmost surface of the digital alloy layer 30. Following the deposition, the sacrificial dielectric layer 40 can be subsequently planarized by a planarization process such as, for example, chemical mechanical planarization (CMP), a recess etch, or a combination thereof. The top surface of the sacrificial dielectric layer 40 thus is coplanar with the topmost surface of the digital alloy layer 30.

Figure 4A:
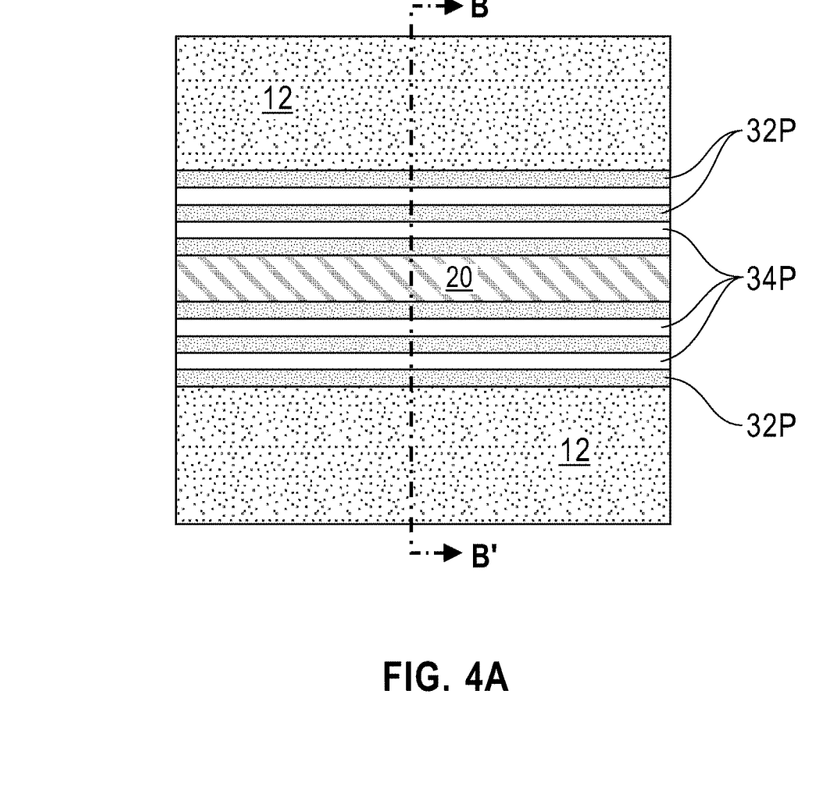
FIG. 4A is a top-down view of the exemplary semiconductor structure of FIG. 3A after removing portions of the digital alloy layer and the sacrificial dielectric layer that are located above a top surface of the sacrificial fin to expose the sacrificial fin and after removing a remaining portion of the sacrificial dielectric layer.
Figure 4B:
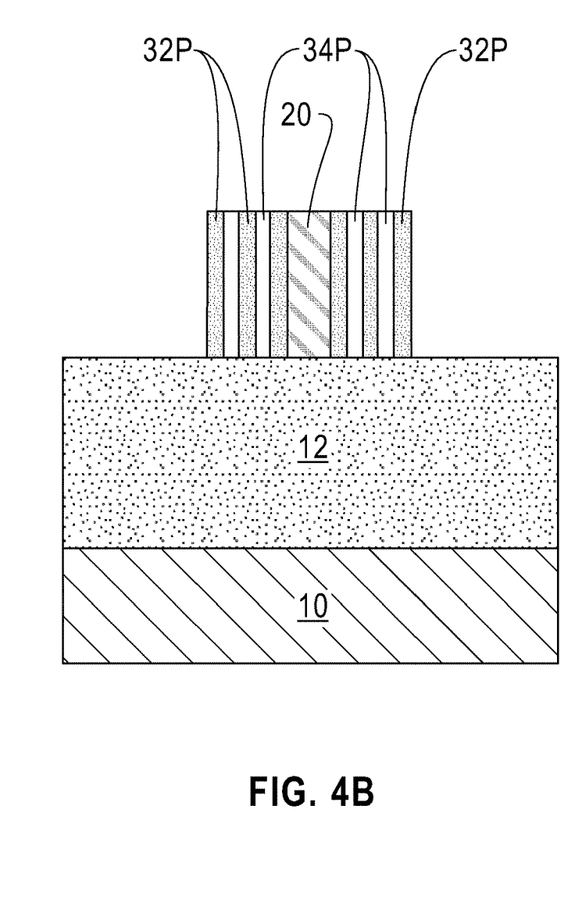
FIG. 4B is a cross-sectional view of the exemplary semiconductor structure of FIG. 4A along line B-B'.

Referring to FIGS. 4A and 4B, portions of the digital alloy layer 30 and the sacrificial dielectric layer 40 that are located above the top surface of the sacrificial fin 20 are removed, for example, by CMP. The sacrificial fin 20 is thus exposed. The remaining portions of each of the SiGe digital alloy sublayers 32 are herein referred to as the SiGe digital alloy sublayer portions 32P, while the remaining portions of each of the Si digital alloy sublayers 34 are herein referred to as the Si digital alloy sublayer portions 34P. Each set of the vertically oriented alternating SiGe digital alloy sublayer portions 32P and Si digital alloy sublayer portions 34P present on one of the sidewalls of the sacrificial fin 20 forms a semiconductor fin. The semiconductor fins (32P, 34P) thus have a lamella structure, which leads to greatly enhanced hole mobility.

After exposing the sacrificial fin 20, the remaining portion of the sacrificial dielectric layer 40 is removed by a selective etch process that removes the dielectric material of the sacrificial dielectric layer 40 selective to the semiconductor materials of the SiGe digital alloy sublayer portions 32P and the Si digital alloy sublayer portions 34 and the dielectric material of the buried insulator layer 12.

Figure 5A:
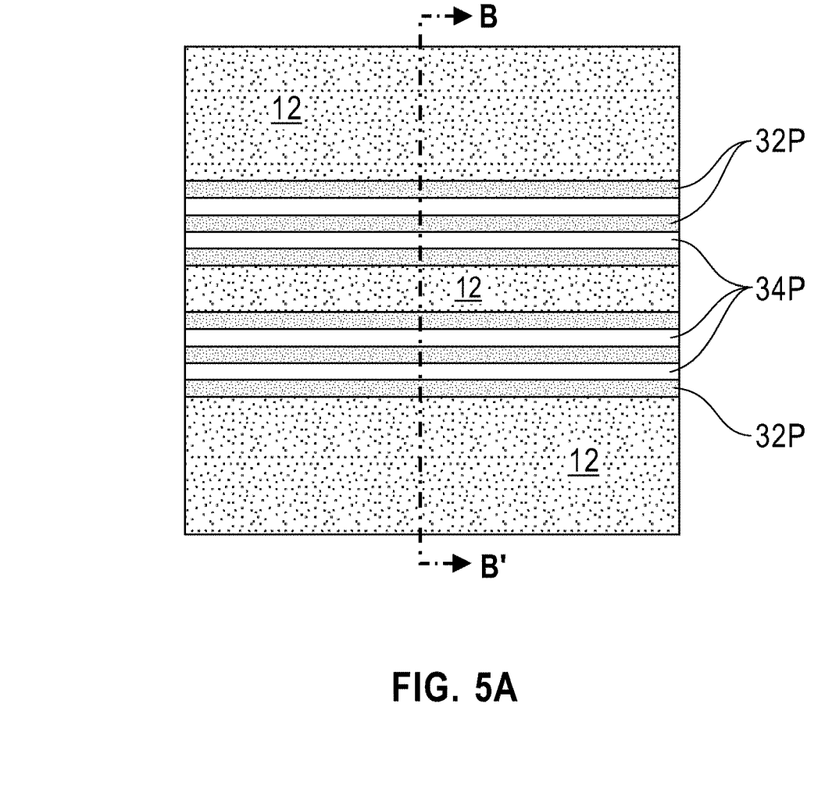
FIG. 5A is a top-down view of the exemplary semiconductor structure of FIG. 4A after removing the sacrificial fin, leaving semiconductor fins composed of alternating SiGe digital alloy sublayer portions and Si digital alloy sublayer portions protruding from the top surface of the substrate.
Figure 5B:
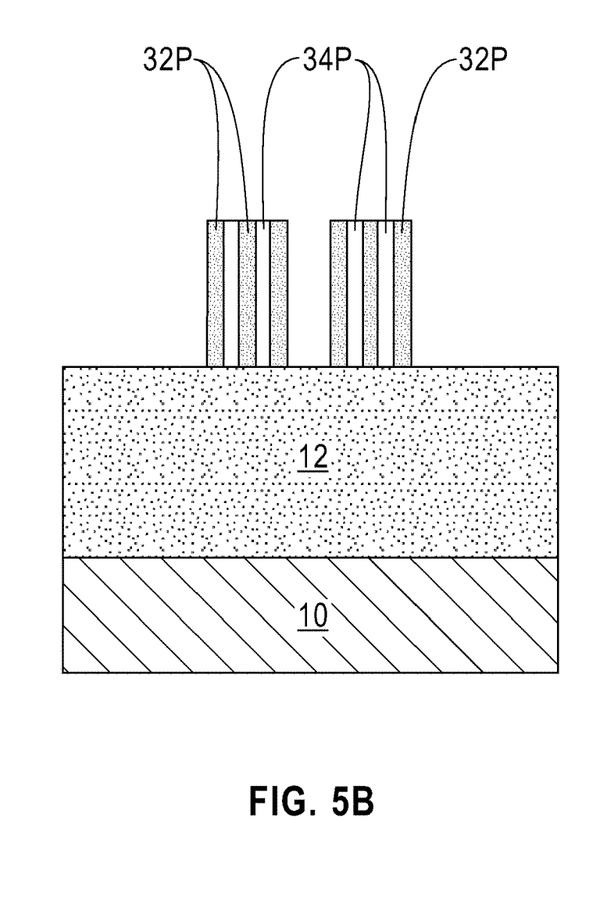
FIG. 5B is a cross-sectional view of the exemplary semiconductor structure of FIG. 5A along line B-B'.

Referring to FIGS. 5A and 5B, the sacrificial fin 20 is removed from the structure, leaving the semiconductor fins (32P, 34P) protruding from the top surface of buried insulator layer 12. The sacrificial fin 20 can be removed by a wet etch that removes the high Ge content SiGe that provides the sacrificial fin 20 selective to the low Ge content SiGe that provides the SiGe digital alloy sublayer portions 32P and Si that provides the Si digital alloy sublayer portions 34P. In one embodiment, the sacrificial fin 20 can be selective etched with an ammonia solution.

Figure 6A:
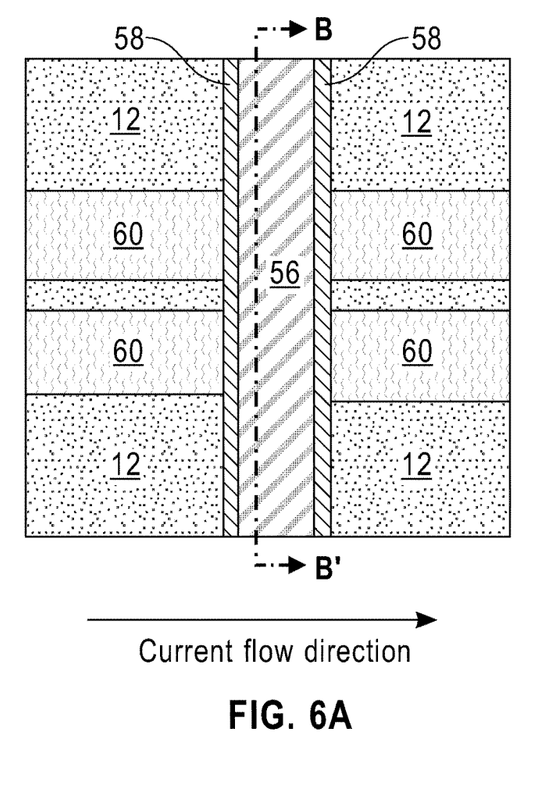
FIG. 6A is a top-down view of the exemplary semiconductor structure of FIG. 5A after forming a gate structure straddling a portion of each semiconductor fin and forming source/drain regions on portions of each semiconductor fin located on opposite sides of the gate structure.
Figure 6B:
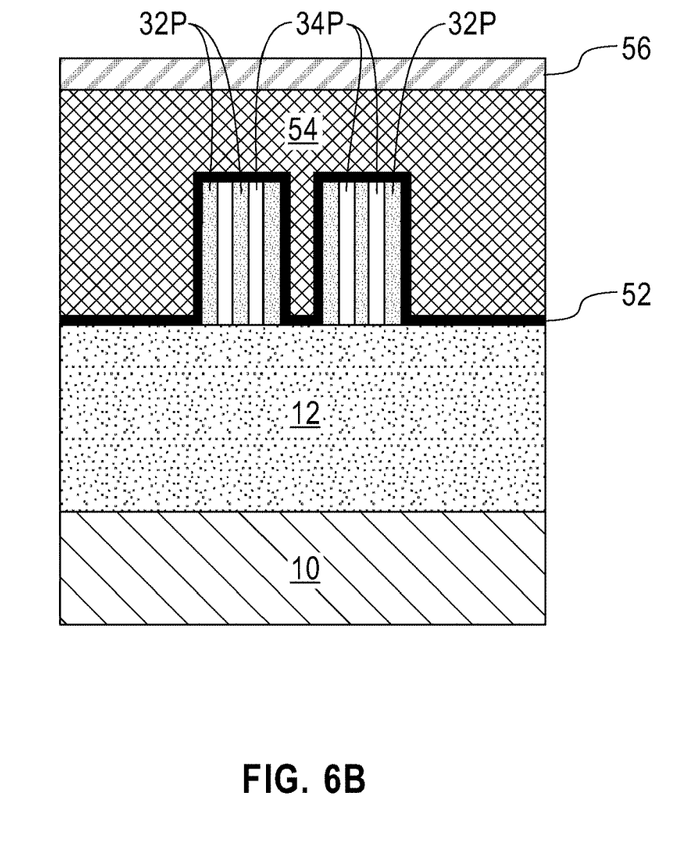
FIG. 6B is a cross-sectional view of the exemplary semiconductor structure of FIG. 6A along line B-B'.

Referring to FIGS. 6A and 6B, a gate stack is formed on (and straddle) a channel portion of each of the semiconductor fin (32P, 34P). The carrier transport direction (i.e., the current flow direction) thus is aligned with the lamella structure comprised of SiGe digital alloy sublayer portions 32P and Si digital alloy sublayer portions 34P. As a result, improved carrier and thermal transport properties can be obtained in a FinFET with these vertically oriented alternating SiGe and Si digital alloy sublayer portions 32P, 34P as the channel compared to a FET with an equivalent random SiGe alloy as the channel.

The gate stack includes at least a gate dielectric 52 and a gate electrode 54. The gate stack may optionally include a gate cap 56. The gate stack (52, 54, 56) may be formed by deposition and patterning of gate stack layers. The patterning of the gate stack layers can be effected by application of a photoresist layer (not shown), lithographic patterning of the photoresist layer, transfer of the pattern in the photoresist layer into the gate stack layers, and removal of the patterned photoresist layer, for example, by ashing. In one embodiment, the materials of the gate stack (52, 54, 56) can be sacrificial materials that are subsequently removed, and are replaced with another gate stack including a functional gate dielectric and a functional gate electrode after doped epitaxial semiconductor material is formed that provides the source and drain regions of the semiconductor structure.

The gate dielectric 52 can include silicon oxide, silicon nitride, silicon oxynitride, or a combination thereof. Alternately or additionally, the gate dielectric 52 can include a high dielectric constant (high-k) dielectric material having a dielectric constant greater than 8.0. Exemplary high-k dielectric materials include, but are not limited to, $HfO_2$, $ZrO_2$, $La_2O_3$, $Al_2O_3$, $TiO_2$, $SrTiO_3$, $LaAlO_3$ or $Y_2O_3$. The gate dielectric 52 can have a thickness from 1 nm to 10 nm, although lesser and greater thicknesses can also be employed.

The gate electrode 54 includes a conductive material. Conductive materials that can be employed for the gate electrode 54 include, but are not limited to, doped semiconductor materials such as, for example, doped polysilicon and metallic materials such as, for example, tungsten, titanium, tantalum, aluminum, nickel, ruthenium, palladium, platinum, or alloys thereof. The gate electrode 54 can have a thickness from 10 nm to 100 nm, although lesser and greater thicknesses can also be employed.

The gate cap 56, if employed, can be comprised of a dielectric material including, for example, silicon oxide, silicon nitride, silicon oxynitride, dielectric, or multilayer stacks thereof. When present, the gate cap 56 can have a thickness from 20 to 100 nm, although lesser and greater thicknesses can also be employed.

A gate spacer 58 can be formed on sidewalls of the gate stack (52, 54, 56). The gate spacer 58 can be formed, for example, by deposition of a conformal dielectric material layer and selective removal of horizontal portions of the deposited conformal dielectric material layer. The remaining vertical portions of the deposited conformal dielectric material layer constitute the gate spacer 28. The gate spacer 58 may be composed of silicon oxide, silicon nitride, silicon oxynitride, or combinations thereof. The width of the gate spacer 58, as measured at the base, can be from 2 nm to 50 nm, although lesser and greater widths can also be employed.

The gate stack (52, 54, 56) and the gate spacer 58 that laterally surrounds the gate stack (52, 54, 56) constitutes a gate structure.

A source region and a drain region (collectively referred to as source/drain regions 60) are subsequently formed on portions of each semiconductor fin (32P, 34P) located on opposite sides of the gate structure (52, 54, 56, 58).

In one embodiment and as shown in FIG. 6A, the source/drain regions 60 include raised source/drain regions formed on the portions of semiconductor fins (32P, 34P) that are not covered by the gate structure (52, 54, 56, 58). The raised source/drain regions may be formed by selective epitaxial growth. During the selective epitaxial growth process, the deposited semiconductor material grows only on exposed semiconductor regions, i.e., the top surface and sidewall surfaces of the portions of semiconductor fins (32P, 34P) on opposite sides of the gate structure (52, 54, 56, 58) and does not grow on dielectric surfaces, such as surfaces of the gate cap 56, the gate spacer 58 and the buried insulator layer 12.

The semiconductor material (i.e., silicon-containing semiconductor material and germanium-containing semiconductor material) of the raised source/drain regions can be deposited as an intrinsic semiconductor material, or can be deposited with in-situ doping. If the semiconductor material is deposited as an intrinsic semiconductor material, the raised source/drain regions can be subsequently doped (ex-situ) utilizing ion implantation, gas phase doping or dopant out diffusion from a sacrificial dopant source material. For n-type FETs, the raised source/drain regions can be doped with an n-type dopant, while for p-type FETs, the raised source/drain regions can be doped with a p-type dopant. Exemplary n-type dopants include, but are not limited to, phosphorous, arsenic and antimony. Exemplary p-type dopants include, but are not limited to, aluminum, boron, gallium and indium.

If ex-situ doping is employed, the ion implantation or gas phase doping also introduce dopants into portions of the semiconductor fins (32P, 34P) that do not underlie the gate stack (52, 54, 56). The resulting doped portions (not shown) within each semiconductor fin (32P, 34P) constitute planar source/drain regions.

If in-situ doping is employed, an anneal process can be performed to outdiffuse the dopants from the raised source/drain regions into underlying portions of the semiconductor fins (32P, 34P) to form the planar source/drain regions.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a semiconductor fin located on a substrate, wherein the semiconductor fin comprises alternating first digital alloy sublayer portions and second digital alloy sublayer portions in direct physical contact with each other and protruding from a top surface of the substrate, wherein at least three first digital alloy sublayer portions are present in the semiconductor fin and are separated from each other by the second digital alloy sublayer portions, wherein each outermost digital alloy sublayer portion of the semiconductor fin is entirely composed of Si and wherein each first digital alloy sublayer portion and each second digital alloy sublayer portion have a topmost surface that is coplanar with each other and a bottommost surface that is coplanar with each other.

2. The semiconductor structure of claim 1, wherein each of the second digital alloy sublayer portions comprises SiGe having a Ge concentration ranging from 15 atomic % to 50 atomic %.

3. The semiconductor structure of claim 1, wherein each of the first digital alloy sublayer portions and the second digital alloy sublayer portions has a thickness ranging from 1.5 nm to 2 nm.

4. The semiconductor structure of claim 1, wherein a total thickness of the first digital alloy sublayer portions and the second digital alloy sublayer portions is from 8 nm to 12 nm.

5. The semiconductor structure of claim 1, wherein the semiconductor fin comprises three first digital alloy sublayer portions alternating with two second digital alloy sublayer portions.

6. The semiconductor structure of claim 1, further comprising a gate stack straddling a channel portion of the semiconductor fin, wherein the gate stack contacts sidewalls of the outermost first and second digital alloy sublayer portions in the semiconductor fin and top surfaces of the alternating first digital alloy sublayer portions and second digital alloy sublayer portions.

7. The semiconductor structure of claim 6, wherein the gate stack comprises a gate dielectric contacting the sidewalls of the outermost first and second digital alloy sublayer portions of the semiconductor fin and the top surfaces of the alternating first digital alloy sublayer portions and second digital alloy sublayer portions, and a gate electrode overlying the gate dielectric.

8. The semiconductor structure of claim 7, wherein the gate dielectric comprises $HfO_2$, $ZrO_2$, $La_2O_3$, $Al_2O_3$, $TiO_2$, $SrTiO_3$, $LaAlO_3$ or $Y_2O$.

9. The semiconductor structure of claim 7, wherein the gate electrode comprises tungsten, titanium, tantalum, aluminum, nickel, ruthenium, palladium, platinum, or alloys thereof.

10. The semiconductor structure of claim 7, wherein the gate stack further comprises a gate cap overlying the gate electrode.

11. The semiconductor structure of claim 6, further comprising a gate spacer present on sidewalls of the gate stack.

12. The semiconductor structure of claim 6, further comprising source/drain regions located on portions of the semiconductor fin that are not covered by the gate stack.

13. The semiconductor structure of claim 12, wherein the source/drain regions are raised source/drain regions comprising a doped semiconductor material.

14. A semiconductor structure comprising:
a finFET device comprising a gate stack straddling a channel portion of a semiconductor fin, wherein the channel portion of the semiconductor fin comprises alternating first digital alloy sublayer portions composed of a silicon germanium alloy and second digital alloy sublayer portions composed of silicon in direct physical contact with each other and protruding from a top surface of a substrate, wherein at least three first digital alloy sublayer portions are present in the semiconductor fin and are separated from each other by the second digital alloy sublayer portions, and wherein each first digital alloy sublayer portion and each second digital alloy sublayer portion have a same vertical height.

15. A semiconductor structure comprising:
a finFET device comprising a gate stack straddling a channel portion of a semiconductor fin, wherein the channel portion of the semiconductor fin comprises alternating first digital alloy sublayer portions composed of silicon and second digital alloy sublayer portions composed of a silicon germanium alloy in direct physical contact with each other and protruding from a top surface of a substrate, wherein at least three first digital alloy sublayer portions are present in the semiconductor fin and are separated from each other by the second digital alloy sublayer portions, and wherein each first digital alloy sublayer portion and each second digital alloy sublayer portion have a same vertical height.

* * * * *